(12) United States Patent
Chen et al.

(10) Patent No.: US 10,586,705 B2
(45) Date of Patent: Mar. 10, 2020

(54) FLUORINE DOPED NON-VOLATILE MEMORY CELLS AND METHODS FOR FORMING THE SAME

(71) Applicant: Taiwan Semiconductor Manufacturing Co., Ltd., Hsinchu (TW)

(72) Inventors: Hung-Lin Chen, Pingtung (TW); Shiuan-Jeng Lin, Hsinchu (TW); Wen-Chih Chiang, Hsinchu (TW); Po-Ming Chen, Shin-Chu (TW); Tza-Hao Wang, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 15/904,041

(22) Filed: Feb. 23, 2018

(65) Prior Publication Data

US 2019/0165180 A1    May 30, 2019

Related U.S. Application Data

(60) Provisional application No. 62/591,389, filed on Nov. 28, 2017.

(51) Int. Cl.
  *H01L 29/66* (2006.01)
  *H01L 21/28* (2006.01)
  (Continued)

(52) U.S. Cl.
  CPC .. *H01L 21/28185* (2013.01); *H01L 21/28158* (2013.01); *H01L 21/3115* (2013.01); *H01L 21/31155* (2013.01); *H01L 21/823462* (2013.01); *H01L 21/823857* (2013.01); *H01L 29/40114* (2019.08); *H01L 29/51* (2013.01); *H01L 29/513* (2013.01);
  (Continued)

(58) Field of Classification Search
  CPC ....... H01L 21/28185; H01L 21/823462; H01L 21/823857; H01L 29/51; H01L 21/28158; H01L 21/3115; H01L 29/513; H01L 29/788; H01L 29/7884; H01L 29/66825
  See application file for complete search history.

(56) References Cited

U.S. PATENT DOCUMENTS

2008/0067636 A1* 3/2008 Shimizu ............ H01L 21/28185
                                                     257/651
2008/0085583 A1* 4/2008 Park .................. H01L 21/02181
                                                     438/261

(Continued)

FOREIGN PATENT DOCUMENTS

JP        06085278 A  *  3/1994

OTHER PUBLICATIONS

Machine Translation of JP06085278.*

*Primary Examiner* — Selim U Ahmed
*Assistant Examiner* — Evan G Clinton
(74) *Attorney, Agent, or Firm* — Duane Morris LLP

(57) ABSTRACT

A non-volatile memory cell is disclosed. In one example, the non-volatile memory cell includes: a substrate; a first oxide layer over the substrate; a floating gate over the first oxide layer; a second oxide layer over the floating gate; and a control gate at least partially over the second oxide layer. At least one of the first oxide layer and the second oxide layer comprises fluorine.

20 Claims, 9 Drawing Sheets

(51) Int. Cl.
*H01L 29/51* (2006.01)
*H01L 21/3115* (2006.01)
*H01L 29/788* (2006.01)
*H01L 21/8234* (2006.01)
*H01L 21/8238* (2006.01)
*H01L 21/266* (2006.01)

(52) U.S. Cl.
CPC ...... *H01L 29/66825* (2013.01); *H01L 29/788* (2013.01); *H01L 29/7884* (2013.01); *H01L 21/266* (2013.01)

(56) References Cited

U.S. PATENT DOCUMENTS

| | | | |
|---|---|---|---|
| 2012/0068245 A1* | 3/2012 | Kim | H01L 21/28273 257/315 |
| 2013/0313626 A1* | 11/2013 | Huang | H01L 29/42328 257/321 |
| 2014/0319596 A1* | 10/2014 | Min | H01L 29/512 257/325 |
| 2018/0076238 A1* | 3/2018 | Lim | H01L 27/3244 |

\* cited by examiner

FLUORINE DOPED NON-VOLATILE MEMORY CELLS AND METHODS FOR FORMING THE SAME

CROSS-REFERENCE TO RELATED APPLICATION

The present application claims priority to U.S. Provisional Patent Application No. 62/591,389, filed on Nov. 28, 2017, which is incorporated by reference herein in its entirety.

BACKGROUND

Memory devices for non-volatile storage of information are widely used in many applications. A few examples of non-volatile semiconductor memories include read only memory (ROM), programmable read only memory (PROM), erasable programmable read only memory (EPROM), electrically erasable programmable read only memory (EEPROM) and flash memory.

Flash memory is a non-volatile computer storage medium that can be electrically erased and reprogrammed. Flash is a type of EEPROM that is erased and programmed in large blocks. Flash memory costs far less than byte-programmable EEPROM. Flash memory is frequently used in computers, telephones, personal digital assistants, GPS receivers, cameras, and a variety of other electronic devices.

A flash memory cell is similar to a standard metal oxide semiconductor field effect transistor (MOSFET), except the transistor has two gates: a top control gate, below which there is a floating gate insulated on all sides by an oxide layer. The floating gate is between the control gate and the channel, and is electrically isolated by the oxide layer. Any electrons placed on the floating gate are trapped there. When the floating gate holds a charge, it reduces the electric field from the control gate, changing the threshold voltage ($V_T$) of the cell. During read-out, a voltage intermediate between the possible threshold voltages is applied to the control gate, and the MOSFET channel either becomes conductive or remains insulating, depending on the actual $V_T$ of the cell, based on the charge in the floating gate. The current flow through the MOSFET channel is sensed, reproducing the stored data.

A single-level flash cell in its default state is logically equivalent to a binary "1" value, because current will flow through the channel under application of an appropriate voltage to the control gate, so that the bit-line voltage is pulled down. A flash memory cell is typically programmed, or set to a binary "0" value by applying voltages to the floating gate transistor in the flash memory cell to cause electrons to be trapped in the transistor's floating gate. Hot-carrier injection (HCI) is a basis of operation for a number of non-volatile memory technologies such as EPROM cells and flash cells. A flash memory exploits the principle of HCI by deliberately injecting carriers across the gate oxide to charge the floating gate. This charge alters the threshold voltage to represent a binary "0" value. The flash memory cell is typically erased by applying voltages to the floating gate transistor to remove any charges trapped in the floating gate of the floating gate transistor.

HCI induces floating gate oxide trapping, where fixed charge or carriers are trapped in the gate oxide. This is called HCI damage, which is one of the factors that cause the number of write-erase cycles to be limited. Floating gate oxide trapping may cause a threshold voltage increase during erase and a threshold voltage decrease during write, which affects the ability of the memory cell to have distinct "1" and "0" charge states. As such, HCI damage results in cell current degradation and the closing of the non-volatile memory logic margin window over time. The number of write-erase cycles at which "1" and "0" can no longer be distinguished defines the endurance of a non-volatile memory. There is no satisfactory method for enhancing the endurance of a non-volatile memory cell, in view of the detrimental influence of HCI.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

DETAILED DESCRIPTION OF EXEMPLARY EMBODIMENTS

Figure 1:
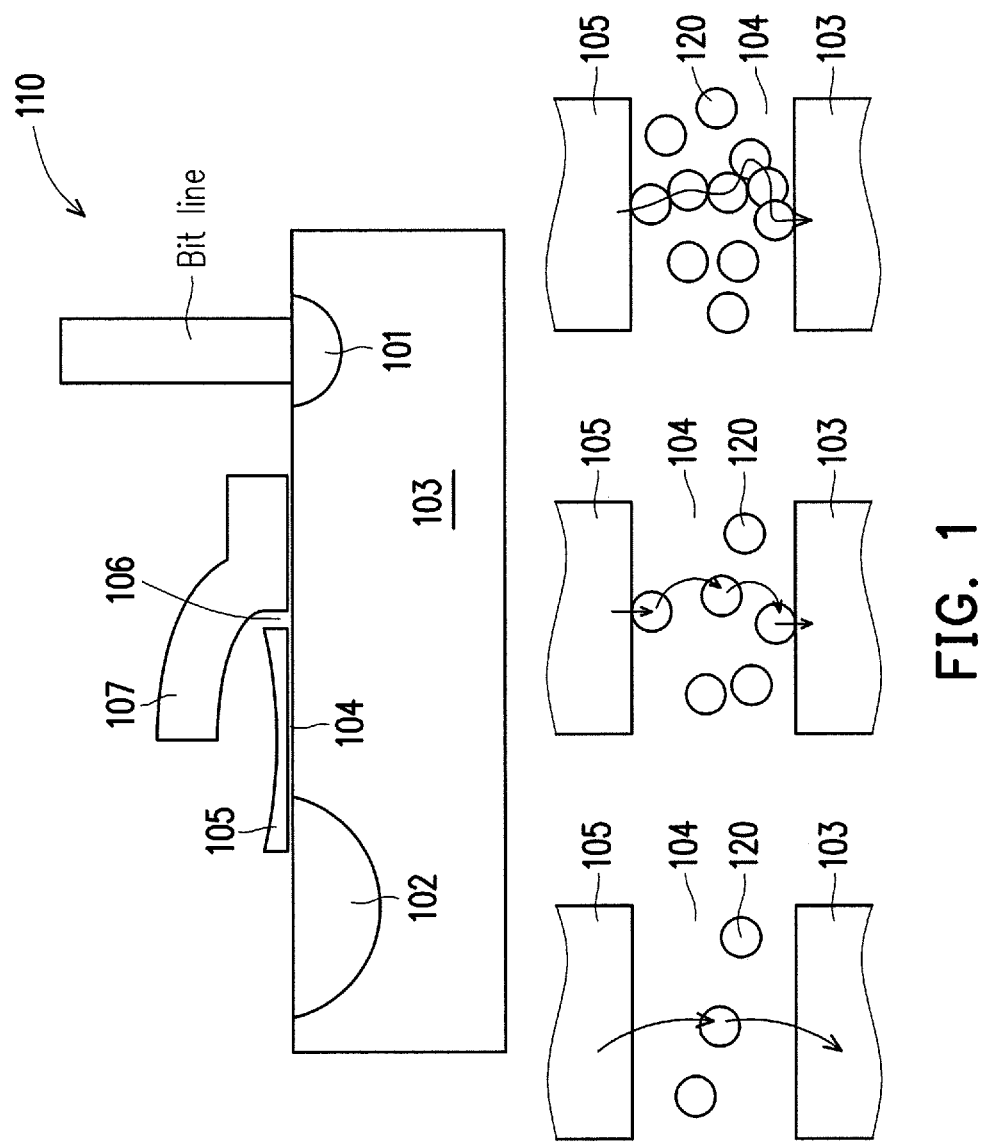
FIG. 1 illustrates an exemplary structure of a flash memory cell, where floating gate oxide trapping happens, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts. In the present disclosure, the terms "memory cell" and "cell" may be interchangeably used.

Hot carrier injection (HCI) is a basis of operation for a number of non-volatile memory technologies such as EPROM cells and flash cells. A flash memory exploits the principle of HCI by deliberately injecting carriers across the gate oxide to charge the floating gate. HCI induces floating gate oxide trapping, where fixed charge or carriers are trapped in the gate oxide, and may cause an increase of the threshold voltage, a cell current degradation, and poor endurance of the memory due to degraded ability to have distinct "1" and "0" charge states.

The present disclosure aims at improving endurance of a non-volatile memory cell, e.g. a flash memory cell, by fluorine doping. The present disclosure provides various embodiments of a non-volatile memory cell that comprises a fluorine doped gate oxide layer. In one embodiment, the fluorine doped gate oxide layer is between a floating gate and a substrate of the memory cell. In another embodiment, the fluorine doped gate oxide layer is between a floating gate and a control gate of the memory cell. In yet another embodiment, the memory cell has two fluorine doped gate oxide layers, one is between the floating gate and the substrate, and another is between the floating gate and the control gate.

Fluorine doping in a gate oxide layer can reduce the fixed charges trapped in the gate oxide layer, by activating a silicon-fluorine (Si—F) bond. A strong bonding strength of the Si—F bond may be created by a furnace annealing and a rapid thermal anneal (RTA). The strong bonding strength can resist HCI damage and reduce floating gate oxide trapping, thereby improving endurance of the memory cell.

The present disclosure further provides a method for forming a non-volatile memory cell that comprises a fluorine doped gate oxide layer. According to various embodiments, the method may include doping fluorine ions into a first oxide layer between the floating gate and the substrate, or into a second oxide layer between the floating gate and the control gate, or into both oxide layers. The fluorine ions may come from any commercial available gas in semiconductor industry, e.g. fluorides including: fluoroboron ($BF_x$), fluoronitrogen ($NF_x$), or fluorosilicon ($SiF_x$).

The present disclosure is applicable to an endurance enhancement of all kinds of non-volatile memory cells where HCI is utilized for write and erase, including a flash memory cell, a multiple time programmable (MTP) memory cell, etc. The flash memory cell may be either a stacked gate flash cell or a split gate flash cell. Through fluorine doping, both the current degradation and endurance of a memory cell can be improved, as discussed in detail below.

FIG. 1 illustrates an exemplary structure of a flash memory cell 110, where floating gate oxide trapping happens, in accordance with some embodiments of the present disclosure. As shown in FIG. 1, the flash memory cell 110 includes a drain 101 connected to a bit line, a source line 102, a substrate 103, a floating gate oxide layer 104, a floating gate 105, an inter-gate oxide layer 106, and a control gate 107.

In one embodiment, the substrate 103 is a semiconductor substrate including silicon; and the floating gate oxide layer 104 includes silicon dioxide. Both the floating gate 105 and the control gate 107 may include polycrystalline silicon. As such, the inter-gate oxide layer 106 may be referred to as an inter-poly oxide layer. During a program operation of the flash memory cell 110, an elevated voltage is applied to the control gate 107 to cause electrons to flow from the source 102 to the drain 101. When the source-drain current is sufficiently high, some high energy electrons jump from the substrate 103 through the floating gate oxide layer 104 onto the floating gate 105. Equivalently, some high energy carriers, i.e. hot carriers, in the floating gate 105 move across the floating gate oxide layer 104 to the substrate 103. This induces floating gate oxide trapping, where one or more fixed charges or carriers 120 are trapped in the floating gate oxide layer 104, and may cause an increase of the threshold voltage, a cell current degradation, and a poor endurance of the flash memory cell 110 due to degraded ability of the flash memory cell 110 to have distinct "1" and "0" charge states.

Figure 2:
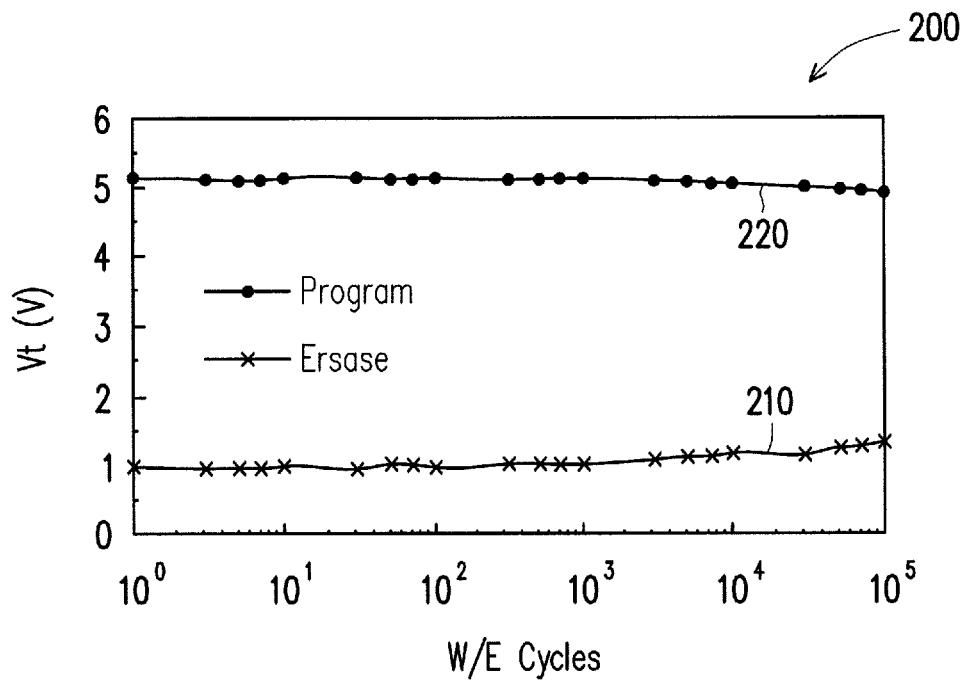
FIG. 2 illustrates an exemplary threshold voltage change of a flash memory cell with increasing write/erase cycles, in accordance with some embodiments of the present disclosure.

FIG. 2 is graph 200 illustrating an exemplary threshold voltage change of a flash memory cell with increasing write/erase cycles, in accordance with some embodiments of the present disclosure. As shown in FIG. 2, due to the floating gate oxide trapping, the threshold voltage during erase increases as write/erase cycles increase; and the threshold voltage during program decreases as write/erase cycles increase. This will result in a closing of the logic margin window of the flash memory cell over time.

Figure 3:
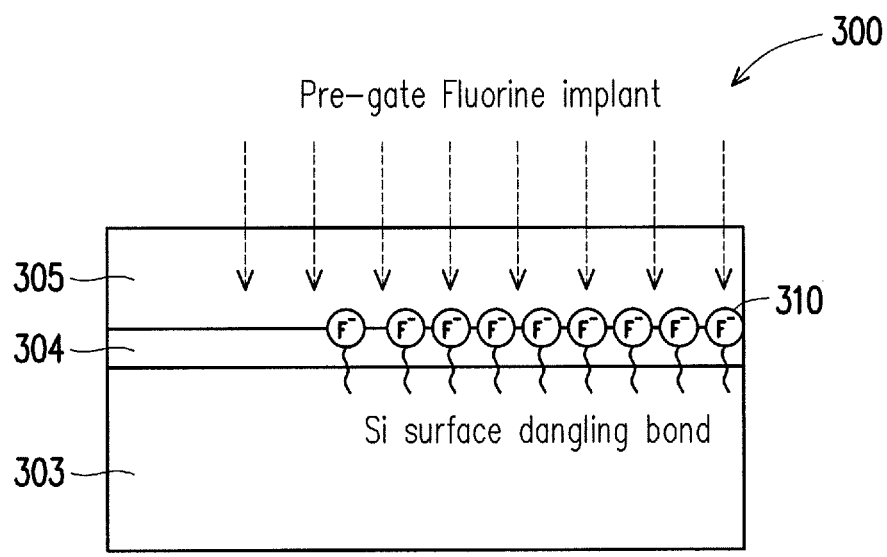
FIG. 3 illustrates an exemplary fluorine implantation in a flash memory cell, in accordance with some embodiments of the present disclosure.

FIG. 3 illustrates an exemplary fluorine implantation in a flash memory cell 300, in accordance with some embodiments of the present disclosure. As shown in FIG. 3, the flash memory cell 300 includes a p-type substrate 303, a gate oxide layer 304 over the p-type substrate 303, and a polysilicon floating gate 305 over the gate oxide layer 304. Fluorine ions 310 may be implanted into the gate oxide layer 304 to create dangling bond with trapped Si-surface charges in the gate oxide layer 304. In one embodiment, the fluorine ions 310 may be implanted right after the polysilicon floating gate 305 is formed. By a furnace annealing or a rapid thermal anneal, the Si—F bond may be activated to neutralize the trapped charges in the gate oxide layer 304. This will improve the endurance of the flash memory cell 300 by avoiding or delaying the closing of the logic margin window of the flash memory cell 300.

Figure 4:
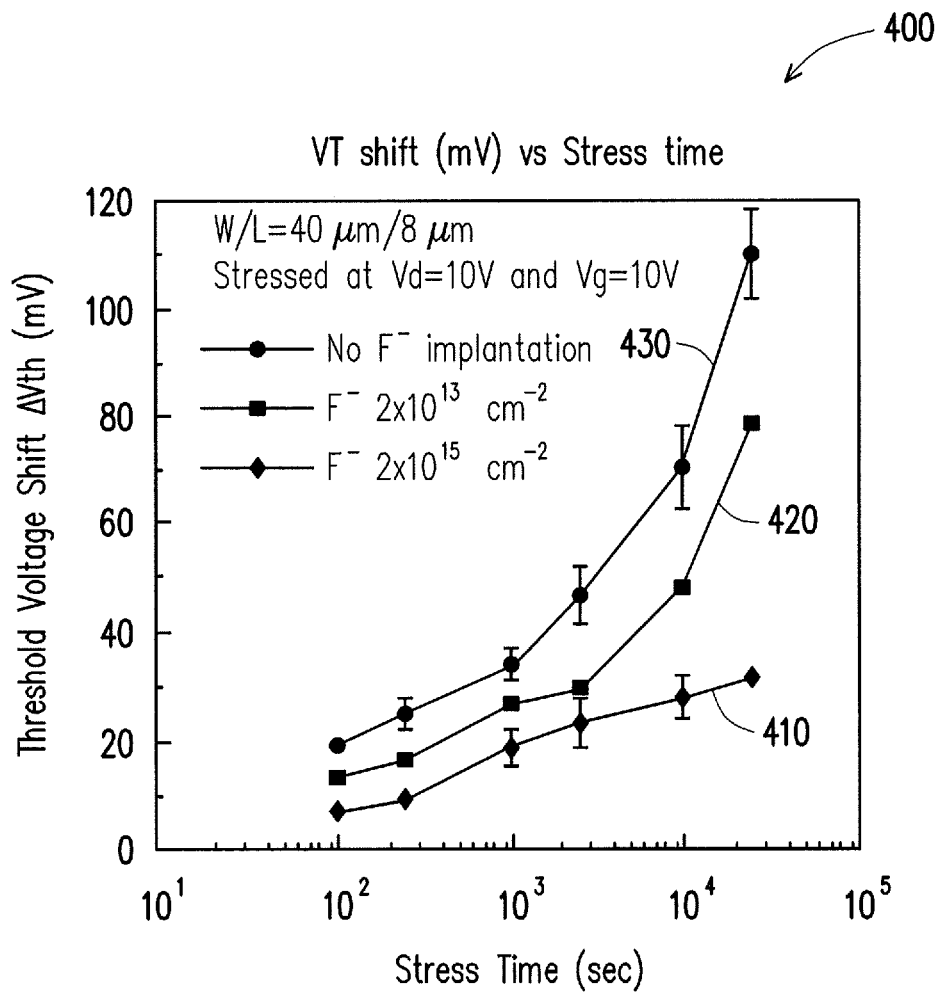
FIG. 4 illustrates an endurance performance comparison between a standard flash memory cell and fluorine doped flash memory cells, in accordance with some embodiments of the present disclosure.

FIG. 4 is graph 400 illustrating an endurance performance comparison between a standard flash memory cell and fluorine doped flash memory cells, in accordance with some embodiments of the present disclosure. As shown in FIG. 4, compared to a standard flash memory cell 430 with no fluorine implantation, fluorine doped flash memory cells 410, 420 have a better endurance in term of smaller threshold voltage shift at a given stress time. The flash memory cell 410 with a higher density ($2*10^{15}$ cm$^{-2}$) of doped fluorine enjoys even better endurance than the flash memory cell 420 with a lower density ($2*10^{13}$ cm$^{-2}$) of doped fluorine.

Figure 5:
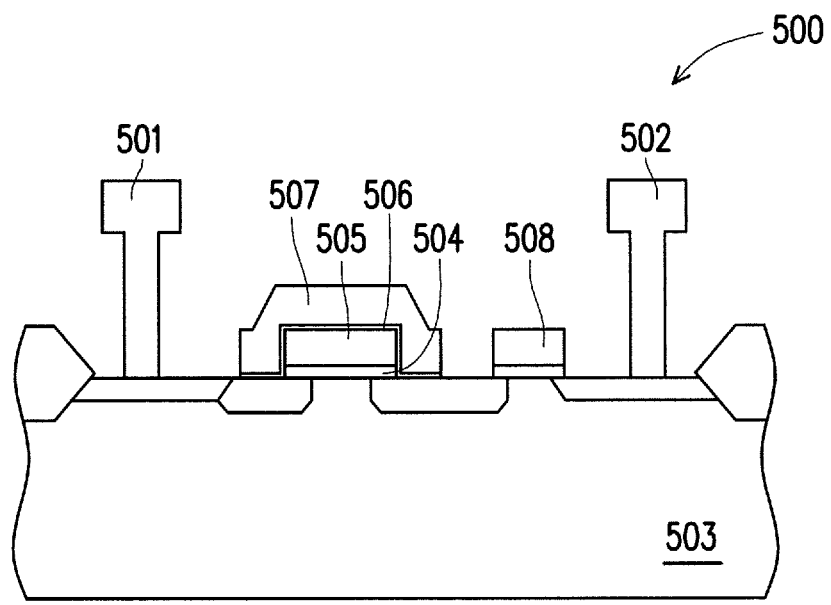
FIG. 5 illustrates an exemplary structure of a stacked gate flash memory cell, in accordance with some embodiments of the present disclosure.

FIG. 5 illustrates an exemplary structure of a stacked gate flash memory cell 500, in accordance with some embodiments of the present disclosure. As shown in FIG. 5, the stacked gate flash memory cell 500 in this example includes a drain 501, a source 502, a substrate 503, a floating gate oxide layer 504, a floating gate 505, an inter-gate oxide layer 506, and a control gate 507. The floating gate oxide layer 504 is formed over the substrate 503; and the floating gate 505 is formed over the floating gate oxide layer 504. The control gate 507 is formed above the floating gate 505 and the floating gate 505 is insulated on all sides from the control gate 507 by the inter-gate oxide layer 506. The floating gate 505 and the control gate 507 may comprise polycrystalline silicon, such that the inter-gate oxide layer 506 may be referred to as an inter-poly oxide layer.

In this example, at least one of the floating gate oxide layer 504 and the inter-gate oxide layer 506 comprises fluorine ions to reduce gate oxide trapping. The fluorine ions may come from any commercial available gas in semiconductor industry or any fluorides including: $BF_x$, $NF_x$, or $SiF_x$.

In one embodiment, the stacked gate flash memory cell 500 further comprises an oxide-nitride-oxide (ONO) layer (not shown) on the floating gate 505. The ONO layer includes two oxide layers and a nitride layer between the two oxide layers. The ONO layer may be formed either above or below the inter-gate oxide layer 506. In another embodiment, the stacked gate flash memory cell 500 may further comprise a select gate 508 over the floating gate oxide layer 504.

Figure 6:
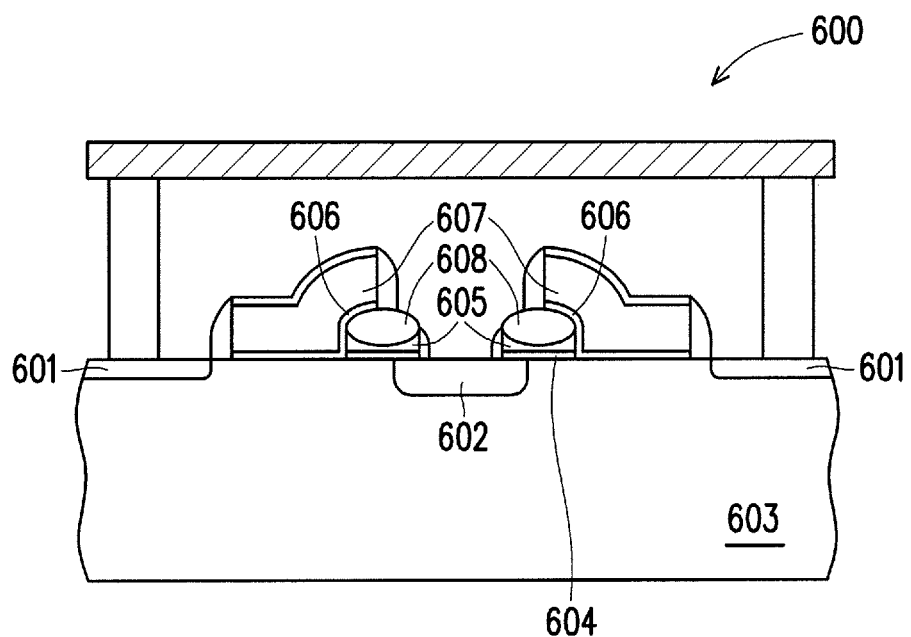
FIG. 6 illustrates an exemplary structure of a split gate flash memory cell, in accordance with some embodiments of the present disclosure.

FIG. 6 illustrates an exemplary structure of a split gate flash memory cell 600, in accordance with some embodiments of the present disclosure. As shown in FIG. 6, the split gate flash memory cell 600 in this example includes two drains 601, a source line 602, a substrate 603, a floating gate oxide layer 604, two floating gates 605, an inter-gate oxide layer 606, and two control gates 607. The floating gate oxide layer 604 is formed over the substrate 603; and the two floating gates 605 are formed over the floating gate oxide layer 604. The source line 602 is a common source diffusion region in the substrate between the two floating gates 605.

The two control gates 607 may serve as a coupling gate and are formed at least partially over the two floating gates 605. The two floating gates 605 are insulated on all sides from the two control gates 607 by the inter-gate oxide layer 606. The two floating gates 605 and the two control gates 607 may comprise polycrystalline silicon, such that the inter-gate oxide layer 606 may be referred to as an inter-poly oxide layer.

The two drains 601 are a pair of drain diffusion regions in the substrate 603. A pair of word lines may be connected to the two control gates 607 and are above a region of the substrate 603 between the drain diffusion regions 601. The split gate flash memory cell 600 may also include an isolation layer 608 between the two floating gates 605 and the inter-gate oxide layer 606. In one embodiment, the isolation layer 608 includes two oxide layers and a nitride layer between the two oxide layers.

In this example, at least one of the floating gate oxide layer 604 and the inter-gate oxide layer 606 comprises fluorine ions to reduce gate oxide trapping. The fluorine ions may come from any commercial available gas in semiconductor industry or any fluorides including: $BF_x$, $NF_x$, or $SiF_x$.

Figure 7:
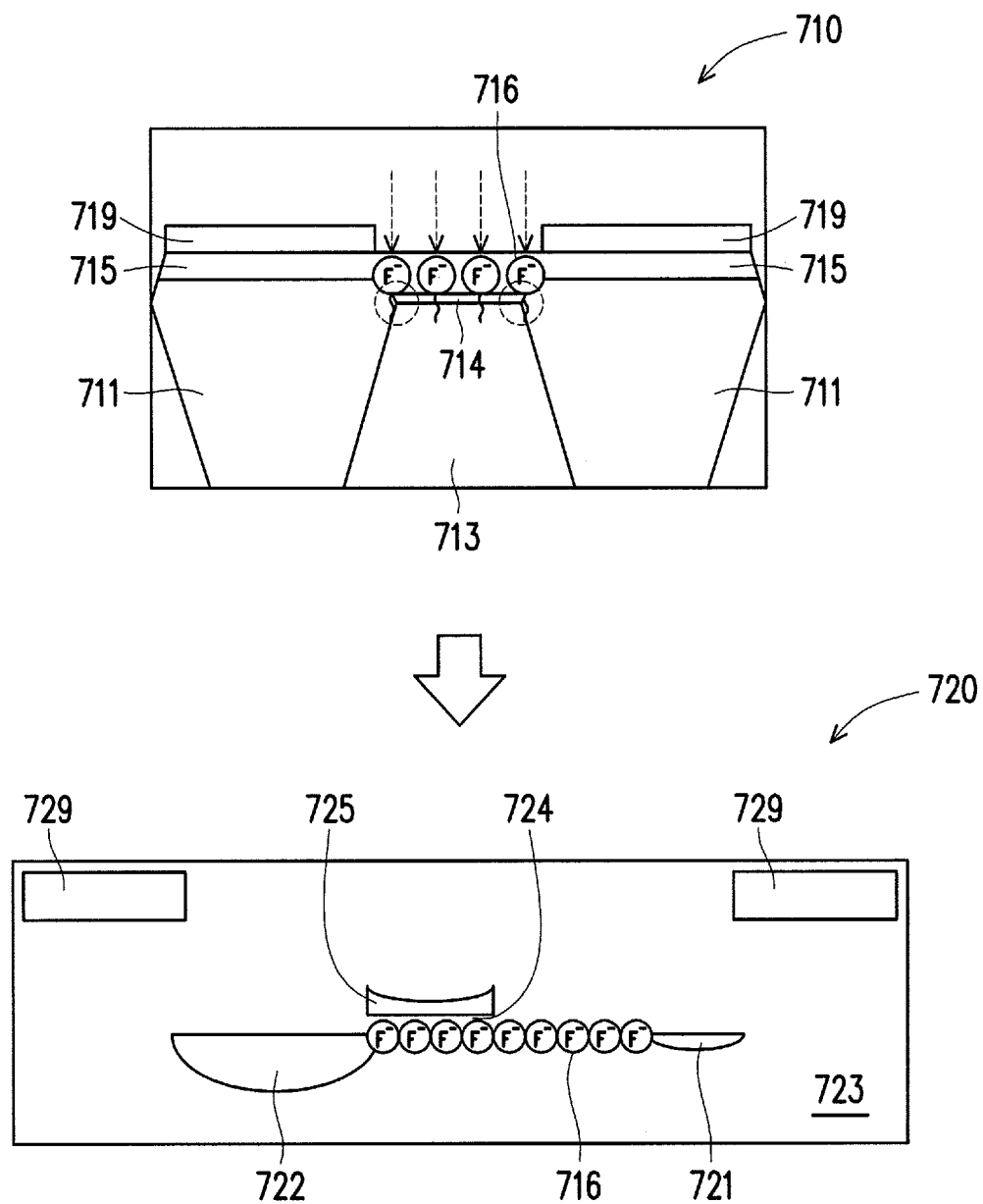
FIG. 7 illustrates an exemplary method for fluorine implantation in a flash memory cell, in accordance with some embodiments of the present disclosure.

FIG. 7 illustrates an exemplary method for fluorine implantation during a manufacturing of a flash memory cell 710, in accordance with some embodiments of the present disclosure. As shown in FIG. 7, the flash memory cell 710 being manufactured includes an active area 713, an isolation area 711 around the active area 713, a floating gate oxide layer 714 over the active area 713, a floating gate 715 deposited onto the isolation area 711 and the floating gate oxide layer 714, and one or more ion masks 719 formed on the floating gate 715. The ion masks 719 are formed on the floating gate 715 to generate a masked pattern for the ion implantation. After the floating gate 715 is deposited and the ions masks 719 are formed, fluorine ions 716 are doped or implanted into the floating gate oxide layer 714 to reduce floating gate oxide trapping and improve endurance of the flash memory cell 710. Through energy control during the ion implantation, the fluorine ions 716 may be doped with an appropriate speed to be implanted into the floating gate oxide layer 714.

FIG. 7 also shows a detailed diagram 720 of the flash memory cell 710, after the fluorine ions 716 are doped. The active area 713 may include a drain 721, a source line 722, and a substrate 723. The fluorine ions 716 are doped into the floating gate oxide layer 724 between the substrate 723 and the floating gate 725. The ion masks 729 can help to block ions at the isolation area and focus the ion implantation on the floating gate oxide layer 724. As shown in FIG. 7, the ion implantation in this example is performed before the control gate or the word line is formed. Some implanted ions 716' will be between the substrate 723 and the word line after word line is formed. In one embodiment, an annealing process is performed to activate a silicon-fluorine bond in the floating gate oxide layer 724 based on at least one of: a furnace annealing and a rapid thermal anneal. The fluorine ions 716 may come from any commercial available gas in semiconductor industry or any fluorides including: $BF_x$, $NF_x$, or $SiF_x$. In one embodiment, pure fluorine ions instead of fluorides are implanted into the floating gate oxide layer 724.

Figure 8:
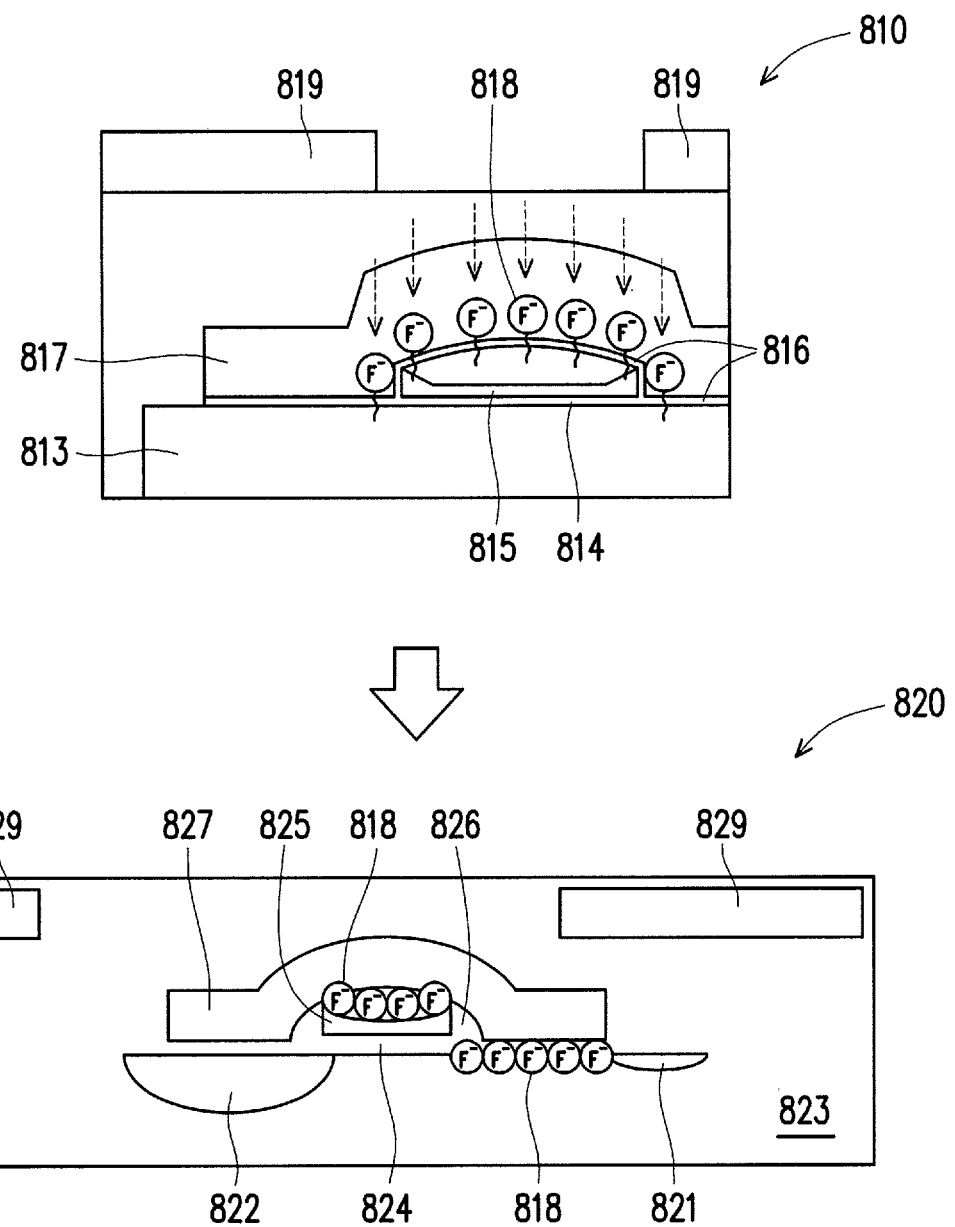
FIG. 8 illustrates another exemplary method for fluorine implantation in a flash memory cell, in accordance with some embodiments of the present disclosure.

FIG. 8 illustrates another exemplary method for fluorine implantation during a manufacturing of a flash memory cell 810 in accordance with some embodiments of the present disclosure. As shown in FIG. 8, the flash memory cell 810 being manufactured includes an active area 813, a floating gate oxide layer 814 over the active area 813, a floating gate 815 deposited onto the floating gate oxide layer 814, an inter-gate oxide layer 816 formed on and around the floating gate 815, and a control gate 817 deposited on the inter-gate oxide layer 816, and one or more ion masks 819 formed above the control gate 817. The ion masks 819 are formed above the control gate 817 to generate a masked pattern for the ion implantation. After the control gate 817 is deposited and the ions masks 819 are formed, fluorine ions 818 are doped or implanted into the inter-gate oxide layer 816 to reduce floating gate oxide trapping and improve endurance of the flash memory cell 810. Through energy control during the ion implantation, the fluorine ions 818 may be doped with an appropriate speed to be implanted into the inter-gate oxide layer 816.

FIG. 8 also shows a detailed diagram 820 of the flash memory cell 810, after the fluorine ions 818 are doped. The active area 813 may include a drain 821, a source line 822, and a substrate 823. The fluorine ions 818 are doped into the inter-gate oxide layer 826. The ion masks 829 can help to block ions at the isolation area and focus the ion implantation on the inter-gate oxide layer 826. As shown in FIG. 8, the ion implantation in this example is performed after the control gate and/or the word line is formed.

The inter-gate oxide layer 826 has an overlapped area with the floating gate oxide layer 824 around the floating gate 825. The overlapped area is between the substrate 823 and the control gate 827. After ion implantation, while some implanted ions 818 are doped into the area between the floating gate 825 and the control gate 827, other implanted ions 818' are doped into the overlapped area between the substrate 823 and the control gate 827 or into the sidewall area of the floating gate 825. As such, the fluorine doping into the inter-gate oxide layer 826 may also reduce the floating gate oxide trapping and improve endurance of the flash memory cell 810.

In one embodiment, both the floating gate 825 and the control gate 827 comprise polycrystalline silicon. In one embodiment, an annealing process is performed to activate a silicon-fluorine bond in the inter-gate oxide layer 826 based on at least one of: a furnace annealing and a rapid thermal anneal. The fluorine ions 818 may come from any commercial available gas in semiconductor industry or any fluorides including: $BF_x$, $NF_x$, or $SiF_x$. In one embodiment, pure fluorine ions instead of fluorides are implanted into the inter-gate oxide layer 826.

Figure 9:
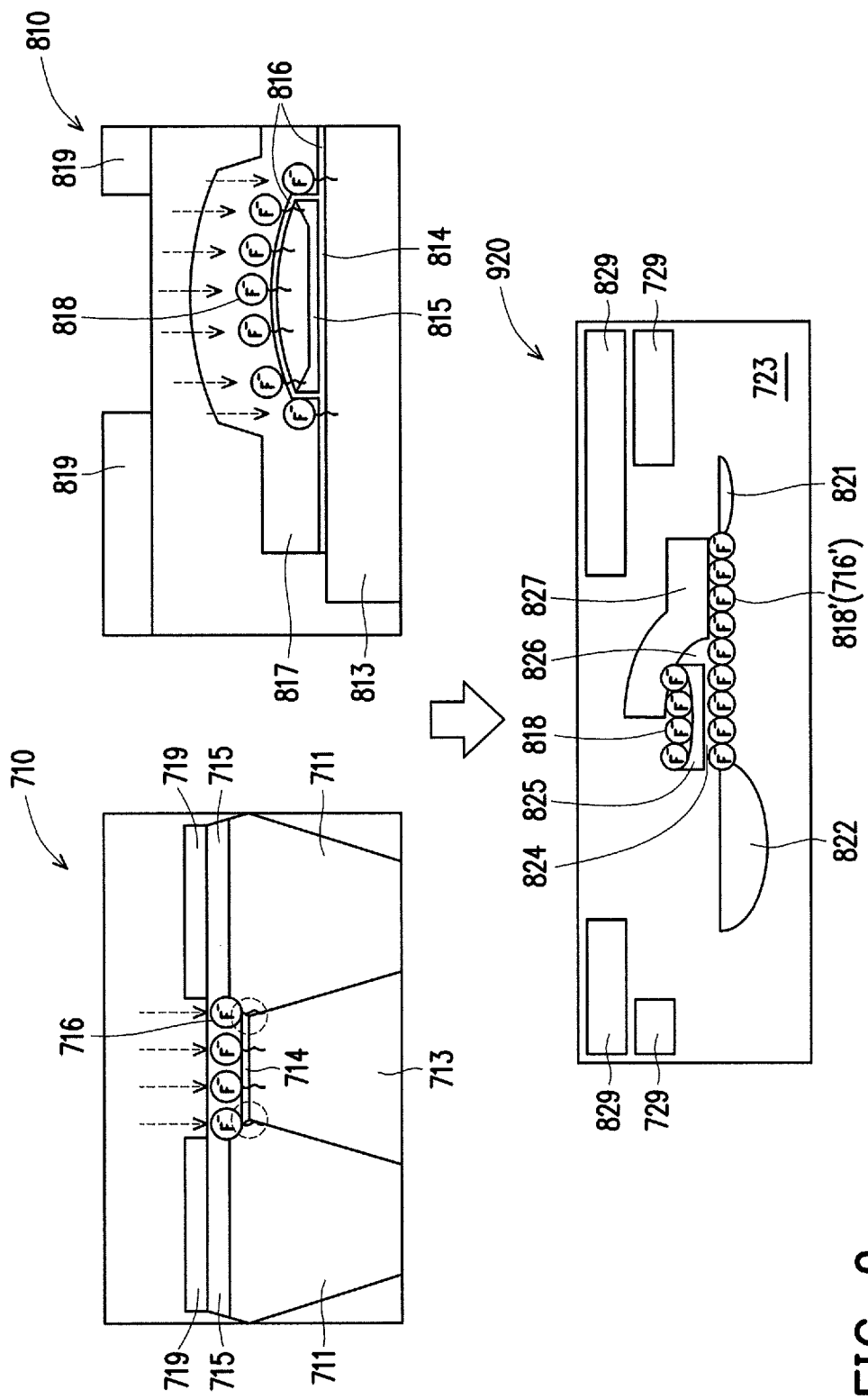
FIG. 9 illustrates yet another exemplary method for fluorine implantation in a flash memory cell, in accordance with some embodiments of the present disclosure.

FIG. 9 illustrates yet another exemplary method for fluorine implantation during a manufacturing of a flash memory cell 910 in accordance with some embodiments of the present disclosure. As shown in FIG. 9, fluorine ions are implanted into the flash memory cell 910 being manufactured twice, once after the floating gate is deposited as in FIG. 7 and another time after the control gate is deposited as in FIG. 8. FIG. 9 shows a detailed diagram 920 of the flash memory cell 910, after the fluorine ions 716, 818 are doped. Similar to the flash memory cell 810 in FIG. 8, the active area of the flash memory cell 910 may include a drain 821, a source line 822, and a substrate 823. The fluorine ions 716 are doped into the floating gate oxide layer 824 before the word line 827 is formed, according to a masked pattern generated by the ion mask 729. The fluorine ions 818 are doped into the inter-gate oxide layer 826 after the word line 827 is formed, according to a masked pattern generated by the ion mask 829.

Through energy control during the ion implantation, each of the two groups 716, 818 of fluorine ions is doped with an appropriate speed to be implanted into the floating gate oxide layer 824 and 826, respectively. The inter-gate oxide layer 826 has an overlapped area with the floating gate oxide layer 824 around the floating gate 825. The overlapped area is between the substrate 823 and the control gate 827. While some implanted ions 818 are doped into the area between the floating gate 825 and the control gate 827, other implanted ions 818' are doped into the overlapped area between the substrate 823 and the control gate 827 or into the sidewall area of the floating gate 825. As such, the fluorine doping into the floating gate oxide layer 824 and the inter-gate oxide layer 826 can reduce the floating gate oxide trapping and improve endurance of the flash memory cell 910.

In one embodiment, an annealing process is performed to activate a silicon-fluorine bond in the floating gate oxide layer 824 and the inter-gate oxide layer 826 based on at least one of: a furnace annealing and a rapid thermal anneal. The fluorine ions 716, 818 may come from any commercial available gas in semiconductor industry or any fluorides including: $BF_x$, $NF_x$, or $SiF_x$. In one embodiment, pure fluorine ions instead of fluorides are implanted into the floating gate oxide layer 824 and the inter-gate oxide layer 826.

In one embodiment, through the fluorine doping in a flash memory cell, the flash cell current degradation in a 1K cycling test was improved by about 22% from 6.1 $\mu A$ degradation to 4.8 $\mu A$ degradation. Accordingly, the forecasted endurance for the flash memory cell is increased from 20K cycles to 50K cycles. In some embodiments, the fluorine ions may be replaced with deuterium (D) ions during ion implantation to create Si-D bonds in the gate oxide layer(s) to reduce hot carrier damage and enhance endurance of the flash memory cell.

Figure 10:
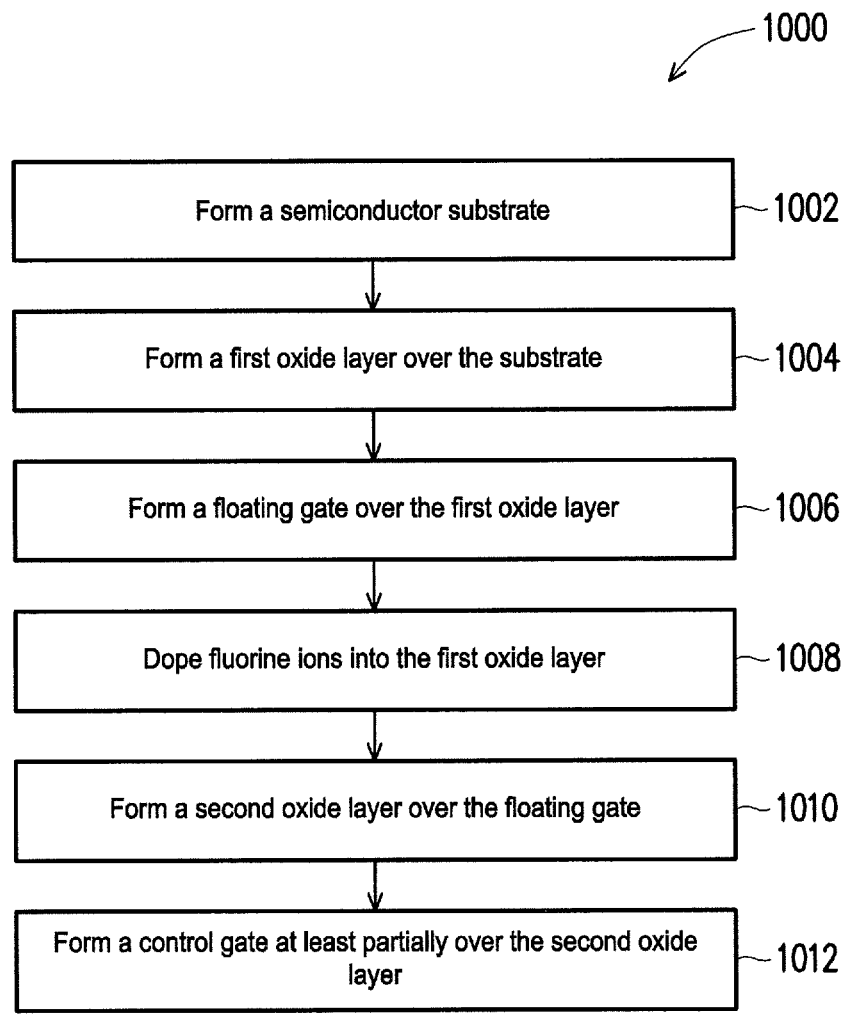
FIG. 10 is a flow chart illustrating an exemplary method for fluorine implantation in a flash memory cell, in accordance with some embodiments of the present disclosure.

FIG. 10 is a flow chart illustrating an exemplary method 1000 for fluorine implantation in a flash memory cell, in accordance with some embodiments of the present disclosure. At operation 1002, a semiconductor substrate is formed. A first oxide layer is formed at operation 1004 over the substrate. A floating gate is formed at operation 1006 over the first oxide layer. Fluorine ions are doped at operation 1008 into the first oxide layer. A second oxide layer is formed at operation 1010 over the floating gate. A control gate is formed at operation 1012 at least partially over the second oxide layer.

Figure 11:
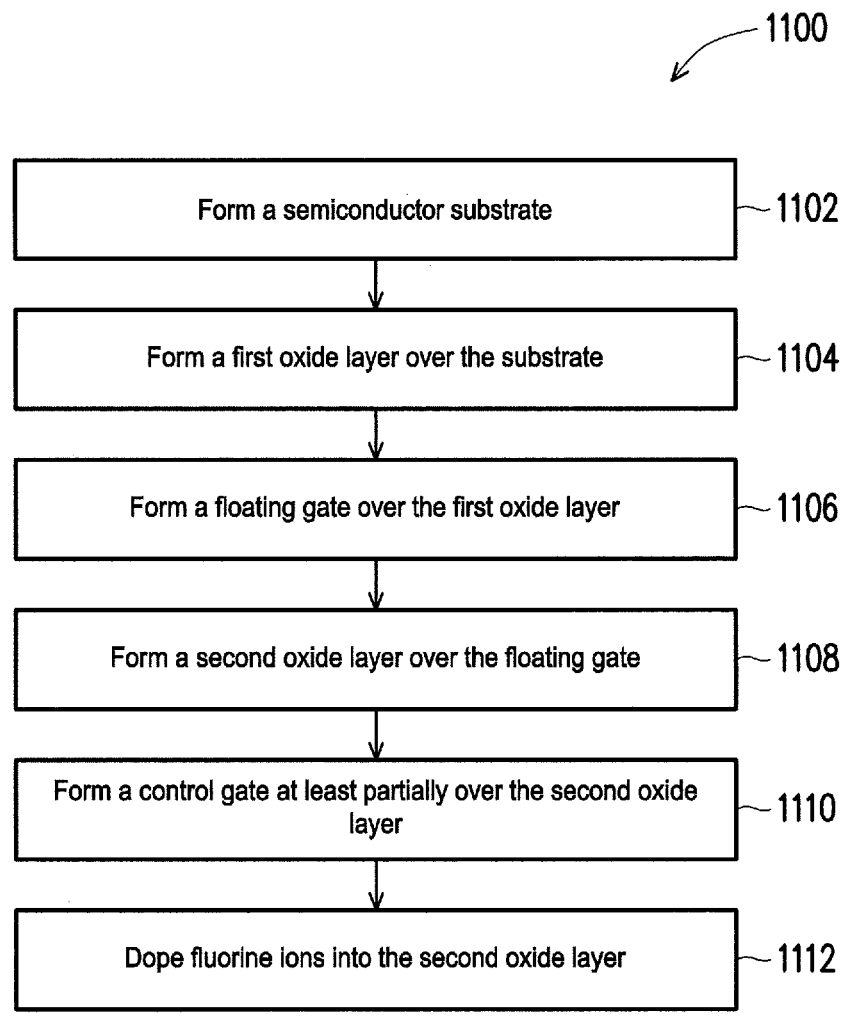
FIG. 11 is a flow chart illustrating another exemplary method for fluorine implantation in a flash memory cell, in accordance with some embodiments of the present disclosure.

FIG. 11 is a flow chart illustrating another exemplary method 1100 for fluorine implantation in a flash memory cell, in accordance with some embodiments of the present disclosure. At operation 1102, a semiconductor substrate is formed. A first oxide layer is formed at operation 1104 over the substrate. A floating gate is formed at operation 1106 over the first oxide layer. A second oxide layer is formed at operation 1108 over the floating gate. A control gate is formed at operation 1110 at least partially over the second oxide layer. Fluorine ions are doped at operation 1112 into the second oxide layer. It can be understood that the order of the steps shown in each of FIG. 10 and FIG. 11 may be changed according to different embodiments of the present disclosure.

In an embodiment, a non-volatile memory cell is disclosed. The non-volatile memory cell includes: a substrate; a first oxide layer over the substrate; a floating gate over the first oxide layer; a second oxide layer over the floating gate; and a control gate at least partially over the second oxide layer. At least one of the first oxide layer and the second oxide layer comprises fluorine.

In another embodiment, a method for forming a non-volatile memory cell is disclosed. The method includes: forming a substrate; forming a first oxide layer over the substrate; forming a floating gate over the first oxide layer; doping fluorine ions into the first oxide layer; forming a second oxide layer over the floating gate; and forming a control gate at least partially over the second oxide layer.

In yet another embodiment, a method for forming a non-volatile memory cell is disclosed. The method includes:

forming a substrate; forming a first oxide layer over the substrate; forming a floating gate over the first oxide layer; forming a second oxide layer over the floating gate; forming a control gate at least partially over the second oxide layer; and doping fluorine ions into the second oxide layer.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A non-volatile memory cell, comprising:
   a substrate;
   a first oxide layer over the substrate;
   a floating gate over the first oxide layer;
   a second oxide layer over the floating gate; and
   a control gate at least partially over the second oxide layer, wherein the second oxide layer comprises fluorine ions that are doped into the second oxide layer through the control gate.

2. The non-volatile memory cell of claim 1, wherein at least one of the floating gate and the control gate comprises polycrystalline silicon.

3. The non-volatile memory cell of claim 1, further comprising an oxide-nitride-oxide (ONO) layer on the floating gate, wherein the ONO layer includes two oxide layers and a nitride layer between the two oxide layers.

4. The non-volatile memory cell of claim 3, wherein the ONO layer is above the second oxide layer.

5. The non-volatile memory cell of claim 3, wherein the ONO layer is below the second oxide layer.

6. The non-volatile memory cell of claim 1, further comprising:
   an additional floating gate over the first oxide layer; and
   a common source diffusion region in the substrate between the floating gate and the additional floating gate.

7. The non-volatile memory cell of claim 1, wherein the second oxide layer comprises at least one of the following fluorides: fluoroboron ($BF_x$); fluoronitrogen ($NF_x$); and fluorosilicon ($SiF_x$).

8. A method for forming a non-volatile memory cell, comprising:
   forming a substrate;
   forming a first oxide layer over the substrate;
   forming a floating gate over the first oxide layer;
   doping fluorine ions into the first oxide layer;
   forming a second oxide layer over the floating gate;
   forming a control gate; and
   doping additional fluorine ions into the second oxide layer after the control gate is formed.

9. The method of claim 8, wherein the fluorine ions are doped into the first oxide layer through the floating gate via ion implantation.

10. The method of claim 9, wherein doping the fluorine ions into the first oxide layer further comprises:
    forming a first ion mask above the floating gate to generate a masked pattern for the ion implantation.

11. The method of claim 8, wherein the control gate is formed at least partially over the second oxide layer.

12. The method of claim 11, wherein the additional fluorine ions are doped into the second oxide layer through the control gate via ion implantation.

13. The method of claim 12, wherein doping the additional fluorine ions into the second oxide layer further comprises:
    forming a second ion mask above the control gate to generate a masked pattern for the ion implantation.

14. The method of claim 11, wherein at least one of the floating gate and the control gate comprises polycrystalline silicon.

15. The method of claim 8, further comprising forming an oxide-nitride-oxide (ONO) layer on the floating gate, wherein the ONO layer includes two oxide layers and a nitride layer between the two oxide layers.

16. The method of claim 8, further comprising:
    forming an additional floating gate over the first oxide layer; and
    forming a common source diffusion region in the substrate between the floating gate and the additional floating gate.

17. The method of claim 8, wherein doping the fluorine ions comprises doping at least one of the following fluorides: fluoroboron ($BF_x$); fluoronitrogen ($NF_x$); and fluorosilicon ($SiF_x$).

18. The method of claim 8, further comprising performing an annealing process to activate a silicon-fluorine bond in the first oxide layer based on at least one of: a furnace annealing and a rapid thermal anneal.

19. A method for forming a non-volatile memory cell, comprising:
    forming a substrate;
    forming a first oxide layer over the substrate;
    forming a floating gate over the first oxide layer;
    forming a second oxide layer over the floating gate;
    forming a control gate at least partially over the second oxide layer; and
    doping fluorine ions into the second oxide layer through the control gate.

20. The method of claim 19, wherein the fluorine ions are doped into the second oxide layer through the control gate via ion implantation.

* * * * *